US011858859B2

(12) United States Patent
Delehouze et al.

(10) Patent No.: US 11,858,859 B2
(45) Date of Patent: Jan. 2, 2024

(54) METHOD FOR DEPOSITING A COATING ON A YARN IN A MICROWAVE FIELD (71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy-Cramayel (FR); Pierre Fenetaud, Moissy-Cramayel (FR); Sylvain Lucien Jacques, Talence (FR)

(73) Assignees: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 18/042,174

(22) PCT Filed: Aug. 11, 2021

(86) PCT No.: PCT/FR2021/051460
§ 371 (c)(1),
(2) Date: Feb. 17, 2023

(87) PCT Pub. No.: WO2022/038324
PCT Pub. Date: Feb. 24, 2022

(65) Prior Publication Data
US 2023/0242453 A1 Aug. 3, 2023

(30) Foreign Application Priority Data
Aug. 21, 2020 (FR) ...................... 2008605

(51) Int. Cl.
*C04B 35/628* (2006.01)
*C04B 35/80* (2006.01)
(Continued)

(52) U.S. Cl.
CPC .. *C04B 35/62884* (2013.01); *C04B 35/62863* (2013.01); *C04B 35/62868* (2013.01);
(Continued)

(58) Field of Classification Search
CPC ........ C04B 35/62884; C04B 35/62863; C04B 35/62868; C04B 35/80; C04B 2235/3826;
(Continued)

(56) References Cited

U.S. PATENT DOCUMENTS

2011/0171399 A1* 7/2011 Brun ....................... C04B 35/80
118/725
2018/0347048 A1* 12/2018 Buet .................. C23C 16/45563
2021/0062343 A1* 3/2021 Delehouze ............ C23C 16/545

FOREIGN PATENT DOCUMENTS

FR  3 044 023 A1  5/2017
FR  3 075 829 A1  6/2019

OTHER PUBLICATIONS

International Search Report as issued in International Application No. PCT/FR2021/051460, dated Nov. 22, 2021.
(Continued)

*Primary Examiner* — Michael G Miller
(74) *Attorney, Agent, or Firm* — Pillsbury Winthrop Shaw Pittman LLP (57) ABSTRACT A method for treating a carbon or ceramic yarn includes forming a coating on the yarn in a reaction zone of a reactor by heating a segment of the yarn in the presence of a gas phase in a microwave field, wherein the gas phase includes a mixture of a diluent gas and a coating precursor in the vapor state, and wherein the gas phase is formed at least by
(Continued)

introducing the diluent gas into the reactor and mixing the introduced diluent gas with the coating precursor in the reactor before the reaction zone.

14 Claims, 5 Drawing Sheets

(51) Int. Cl.
*C23C 16/04* (2006.01)
*C23C 16/32* (2006.01)
*C23C 16/34* (2006.01)
*C23C 16/448* (2006.01)
*C23C 16/511* (2006.01)
*C23C 16/54* (2006.01)
*C23C 16/56* (2006.01)

(52) U.S. Cl.
CPC ............ *C04B 35/80* (2013.01); *C23C 16/045* (2013.01); *C23C 16/325* (2013.01); *C23C 16/342* (2013.01); *C23C 16/345* (2013.01); *C23C 16/4482* (2013.01); *C23C 16/511* (2013.01); *C23C 16/545* (2013.01); *C23C 16/56* (2013.01); *C04B 2235/386* (2013.01); *C04B 2235/3826* (2013.01); *C04B 2235/5248* (2013.01); *C04B 2235/5252* (2013.01); *C04B 2235/614* (2013.01)

(58) Field of Classification Search
CPC ...... C04B 2235/386; C04B 2235/5248; C04B 2235/5252; C04B 2235/614; C23C 16/045; C23C 16/325; C23C 16/342; C23C 16/345; C23C 16/4482; C23C 16/511; C23C 16/545; C23C 16/56
See application file for complete search history.

(56) References Cited

OTHER PUBLICATIONS

International Preliminary Report on Patentability and the Written Opinion of the International Searching Authority as issued in International Patent Application No. PCT/FR2021/051460, dated Feb. 16, 2023.

* cited by examiner

METHOD FOR DEPOSITING A COATING ON A YARN IN A MICROWAVE FIELD

CROSS-REFERENCE TO RELATED APPLICATIONS

This application is the U.S. National Stage of PCT/FR2021/051460, filed Aug. 11, 2021, which in turn claims priority to French patent application number 2008605 filed Aug. 21, 2020. The content of these applications are incorporated herein by reference in their entireties.

TECHNICAL FIELD

The present invention relates to the general field of methods for depositing a coating on a carbon or silicon carbide yarn by coupling with a microwave field in the presence of a coating precursor in the vapor state.

PRIOR ART

Ceramic matrix composite materials (CMC), known for their good mechanical properties which make them suitable for constituting structural elements and for maintaining these properties at high temperatures, constitute a viable alternative to conventional metal parts. Their reduced mass compared to their metallic equivalent makes them the parts of choice to meet the problems of increasing efficiency and reducing polluting emissions from engines in the aeronautical field.

CMC material parts comprise a fibrous reinforcement generally in the form of a woven textile, which is densified by a ceramic matrix. The fibrous reinforcement can comprise long filaments, generally grouped together in the form of yarns, the orientation of which can be adapted to the main directions of stress on the part during its use. The preform intended to form the fibrous reinforcement must be woven from yarns to the dimensions of the part (for example by two-dimensional or three-dimensional weaving), using a suitable loom. To produce a CMC material part which has improved mechanical properties, it is known to use yarns in the fibrous preform which are coated with an interphase, prior to the densification of the preform.

The deposition of an interphase coating on the yarns of an already woven fibrous preform by chemical vapor infiltration ("CVI") is known. In addition to the high cost and low kinetics of this technique, the interphase formed on the yarns is generally not homogeneous and interphase thickness gradients can be observed between the surface and the core of the preform, and locally between the filaments located at the surface and at the core of the yarn. This inhomogeneity of the deposition within the preform can reduce the final mechanical properties of the densified part.

With a view to overcoming this problem, it has been proposed in document FR 3 075 829 to deposit a coating from a precursor in a microwave field. This technique gives satisfactory results but the homogeneity of the coating obtained can still be improved, as well as the control of its stoichiometry.

DISCLOSURE OF THE INVENTION

The present invention relates to a method for treating a carbon or ceramic yarn comprising at least forming a coating on the yarn in a reaction zone of a reactor by heating a segment of the yarn in the presence of a gas phase in a microwave field, characterized in that the gas phase comprises a mixture of a diluent gas and a coating precursor in the vapor state, and in that the gas phase is formed at least by introducing the diluent gas into the reactor and mixing the introduced diluent gas with the coating precursor in the reactor before the reaction zone.

A "yarn segment" here corresponds to a certain length of yarn, in other words, the segment extends along the length or the longest dimension of the yarn. A yarn can comprise several filaments, a yarn segment can comprise several filaments. The segment of the yarn is heated, in the reaction zone, by direct coupling via microwaves, which allows to bring its surface to a temperature sufficient to form the coating from the coating precursor in the vapor state. The yarn segment is heated as a whole, which allows a homogeneous and rapid formation of the coating on the latter with a limited amount of energy because the yarn segment is heated directly by the microwave field. Furthermore, the invention proposes supplying diluent gas which is mixed with the precursor in the reactor before the reaction zone. The use of the diluent gas allows to dilute the rate of reagent and to control the kinetics of deposition so as to obtain a more homogeneous deposition. As will be detailed below, the diluent gas can, when introduced, be mixed with the coating precursor while it is in the liquid state or already in the vapor state.

In an exemplary embodiment, the diluent gas reacts with excess carbon from the coating precursor before the reaction zone and/or with excess carbon from the coating formed in the reaction zone.

The diluent gas can thus be reactive with respect to the precursor and/or the coating in order to consume the excess carbon causing a deviation from the stoichiometry desired for the coating. This reaction can be an oxidation reaction or preferably a reduction reaction. By way of example, the reactive diluent gas may include dihydrogen ($H_2$) or ammonia ($NH_3$). In this case, a reduction reaction is carried out to consume the excess carbon. The use of dihydrogen may be preferred over ammonia for the case of a silicon carbide coating for example, because it allows to avoid any risk of parasitic nitriding of the coating formed on the yarn. In other cases, the use of ammonia may be preferred over dihydrogen, this is the case for example in the case of a boron nitride coating because the ammonia provides additional nitrogen to adjust the stoichiometry of the coating formed. Alternatively, it is possible to carry out an oxidation of the excess carbon of the precursor and/or of the coating by using a reactive diluent gas including dioxygen, a nitrogen oxide, for example $N_2O$, or a carbon oxide, for example CO or $CO_2$. Such oxidation can be implemented in the case of the formation of an oxide coating.

Alternatively, the diluent gas is inert with respect to the coating precursor and/or with respect to the coating formed in the reaction zone. By way of example, the inert diluent gas may include dinitrogen ($N_2$) or argon (Ar).

It will be noted that it is not beyond the scope of the invention if the diluent gas comprises a mixture of at least one reactive gas and at least one inert gas.

In an exemplary embodiment, forming the gas phase comprises evaporating the liquid coating precursor in the reactor by contact with a hot portion of the yarn adjacent to the segment present in the microwave field.

The portion of the yarn adjacent to the coating is heated by conduction and radiation from the yarn segment present in the microwave field. It is thus possible to dispense with a specific heating means at the liquid precursor. This makes the method simpler and more energy efficient.

In particular, the diluent gas can be mixed with the liquid coating precursor as it is introduced into the reactor.

Such a characteristic is advantageous because it promotes the evaporation of the liquid coating precursor and its entrainment in the reaction zone and allows to modulate the flow rate of precursor in the reaction zone.

Alternatively or in combination, the diluent gas is mixed with the coating precursor in the vapor state as it is introduced into the reactor.

The invention is however not limited to a vaporization of the coating precursor in the liquid state carried out in the reactor. Indeed, in an exemplary embodiment, forming the gas phase comprises introducing the coating precursor in the vapor state into the reactor and mixing the diluent gas with the coating precursor in the vapor state thus introduced.

In an exemplary embodiment, the volume fraction of diluent gas in the gas phase is greater than or equal to the volume fraction of coating precursor in the vapor state in the gas phase, for example greater than or equal to twice this volume fraction. Such a characteristic advantageously allows to further improve the homogeneity of the coating obtained on the yarn.

The volume fraction of coating precursor in the vapor state in the gas phase can be comprised between 15% and 75%, preferably between 25% and 50%, and the volume fraction of diluent gas in the gas phase can be comprised between 25% and 85%, preferably between 50% and 75%.

The yarn can be moved in the reactor during its treatment. Thus, upon heating the yarn segment, the segment may be in a first position, and the method may further comprise moving the yarn so as to position the segment in a second position in which the segment is out of the microwave field. In other words, the method can comprise a step of moving the yarn in the microwave field and in the reactor. This advantageous arrangement allows to form the coating over the entire length of the yarn more easily. In this case, the scrolling of the yarn can be carried out continuously, that is to say uninterrupted during the deposition, or step by step, that is to say that the yarn is stopped during the deposition then moved so as to position a second segment in the reaction zone after deposition on a first segment.

In an exemplary embodiment, the coating precursor is a silicon carbide (SiC) precursor.

It is thus possible to deposit silicon carbide on the yarn, this coating allowing in particular to protect the yarn against oxidation and/or during the subsequent steps of forming the composite material part.

Alternatively, the coating precursor is a boron nitride (BN) precursor.

Boron nitride is an interphase material, that is to say having a function of debrittlement of the composite material which favors the deviation of any cracks reaching the interphase after having propagated in the matrix, preventing or delaying the breakage of yarns by such cracks.

Further alternatively, the coating precursor is a silicon nitride ($Si_3N_4$) precursor. In general, the coating formed on the yarn can be a ceramic coating, for example carbide or nitride, for example boron carbide, boron nitride or silicon nitride.

In an exemplary embodiment, the yarn is moved in the reactor, and the segment of yarn covered with the coating is transported to an additional treatment zone separate from the reaction zone where it undergoes a heat treatment.

The temperature imposed in the additional treatment zone may be greater than or equal to the temperature in the reaction zone. The temperature imposed in the additional treatment zone can be greater than or equal to 1100° C., for example 1200° C. This temperature can for example be comprised between 1100° C. and 1700° C., for example between 1200° C. and 1500° C.

In particular, the heat treatment can lead to dehydrogenation of the coating covering the yarn. This may be the case, for example, when the coating formed is made of silicon carbide if the chosen precursor leads to a coating with an excess of hydrogen. In particular, the heat treatment can lead to crystallization or stabilization of the coating covering the yarn, this is the case for example when the coating formed is boron nitride. Stabilization of the coating means that the coating is made less sensitive to air.

The invention also relates to a method for manufacturing a composite material part, comprising:
    forming a fibrous preform of the part from yarns treated by the method as described above, and
    forming a matrix in the porosity of the obtained fibrous preform.

The matrix may be at least partially ceramic, for example predominantly in ceramic volume.

DESCRIPTION OF EMBODIMENTS

Figure 1:
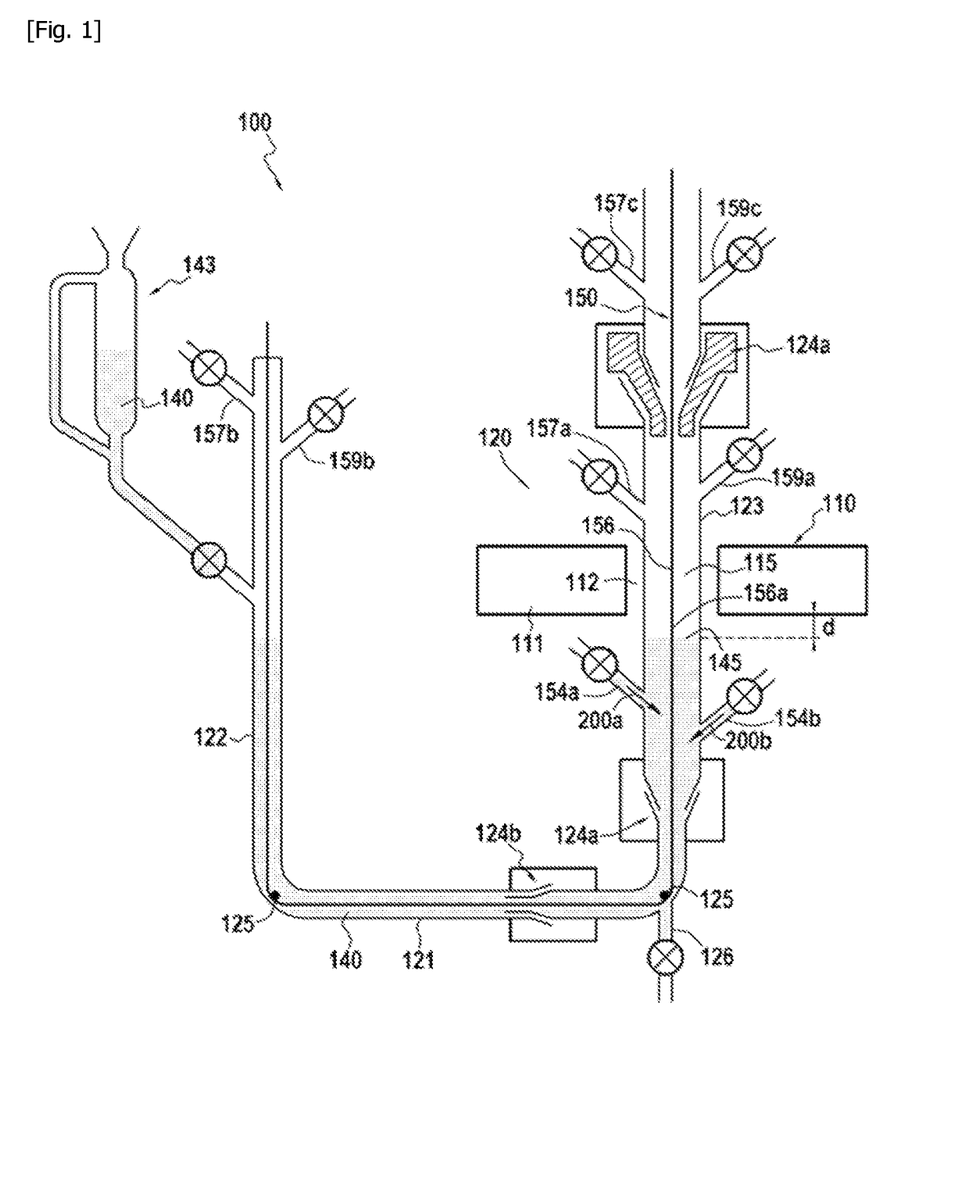
FIG. 1 schematically shows a device for implementing a first example of a method according to the invention.

FIG. 1 shows a device 100 for implementing an example of a method according to the invention. In this example, the coating precursor 140 is present in the liquid state in the reactor 120 and the diluent gas 200a, 200b is directly injected into the liquid precursor 140.

The device 100 comprises a microwave generator 110, a reactor 120, and a scrolling device (not shown) which allows to move the yarn 150 in the reactor 120. The treated yarn 150 is made of carbon or ceramic, for example of silicon carbide. The material of the yarn 150 is chosen so as to be coupled with the microwave field in the reaction zone 115 in order to cause its heating. In an exemplary embodiment, the yarn 150 can be made of silicon carbide having an oxygen content less than or equal to 1% in atomic percentage. It is possible, for example, to use a yarn of the Hi-Nicalon type S type marketed by the Japanese company NGS. It will be noted that the treated yarn 150 may or may not already be coated with another material.

The microwave generator 110 here comprises a resonator 111 defining a resonant cavity 112, the resonator 111 is connected to a wave generator (not shown). In operation, the resonant cavity 112 is traversed by a microwave field. The microwave field can be characterized by its power (or amplitude) and its frequency, which can be easily determined by the person skilled in the art to obtain a surface temperature of the yarn suitable for forming the coating from a given coating precursor. The microwave field may have a main frequency comprised between 2.35 GHz and 2.55 GHz. For example, the use of a microwave generator with a main frequency of 2.45 GHz allows the heating of a yarn made up of around 500 silicon carbide filaments. The heating is then done in a very localized manner only on the yarn: the heating is then qualified as direct coupling in a cold-wall reactor.

The reactor 120 can be made of a material transparent to microwaves, for example quartz. The reactor 120 may have the shape of a tube, having for example a U-shape. The reactor 120 may have a base portion (here a horizontal portion) 121, a first branch (here a first vertical portion) 122 and a second branch (here a second vertical portion) 123, each of the vertical portions 122 and 123 being connected to the horizontal portion 121. The first vertical portion 122 can be connected to a first end of the horizontal portion 121 and the second vertical portion 123 at a second end of the horizontal portion 121, opposite the first end. The second vertical portion 123 of the reactor 120 is here present at least partly in the resonant cavity 112 of the resonator 111, that is to say that it traverses the resonator 111. The portion of the reactor 120 present in the resonant cavity 112 forms the reaction zone 115. The yarn 150 can be placed at an antinode of the microwave field in the reaction zone 115. Only a branch or a vertical portion 123 of the reactor 120 can be present in the microwave field. The shape of the reactor 120 allows to introduce a liquid precursor 140. The level of liquid can be regulated by adding a precursor in one of the two vertical portions 122 and 123, for example in the first vertical portion 122 using a dropping funnel 143 connected to the reactor 120 as in the non-limiting example illustrated. The amount of liquid can be regulated manually or controlled by a sensor at the precursor and an automated precursor supply device. In the latter case, it is possible to use a liquid flowmeter connected upstream to a pressurized canister, the regulation of the level being able to be done by an optical sensor of the level of liquid in the portion 122, said sensor controlling the regulation valve of the flowmeter. Furthermore, the reactor 120 can be provided with a purge valve 126 in order to evacuate the precursor 140 at the end of the deposition. The meniscus 145 of the precursor 140 is located below the resonant cavity 112 or below the reaction zone 115. In particular, there is no liquid precursor 140 in the reaction zone 115 in the example illustrated. A yarn portion 156a contiguous to the yarn segment 156 present in the microwave field is heated by thermal conduction. The portion 156a contacted with the liquid precursor 140 allows its evaporation at the meniscus 145. The precursor 140 thus evaporated spreads towards the reaction zone 115 to carry out the deposition on the yarn. Pumping can be performed to force this natural propagation of the precursor 140 towards the reaction zone 115. The coating is formed from the gas phase in the reaction zone by chemical vapor infiltration, the coating covering the surface of the filaments forming the yarn 150 and being deposited in the inter-filament spaces. The distanced from the meniscus 145 to the reaction zone 115 can be greater than or equal to 1 cm, for example greater than or equal to 5 cm, for example comprised between 1 cm and 15 cm, for example comprised between 5 cm and 15 cm. This distance may depend on the temperature imposed on the yarn in the reaction zone, as will be detailed below.

The reactor 120 is further provided with two centralizers 125 present respectively at the two junctions between the horizontal portion 121 and the two vertical portions 122 and 123 of the reactor 120. The centralizers 125 can be in the shape of rollers provided with a groove (not visible in the figures) which have the function of keeping the yarn 150 centered in the reactor 120. The centralizers 125 are present inside the reactor 120. The second vertical portion 123 and the horizontal portion 121 each comprise at least one additional centralizer 124a and 124b. All or part of the additional centralizers 124a and 124b can locally narrow the section of the reactor 120. It is also possible to add an additional centralizer (not shown) in the first vertical portion 122.

The device is provided with a scrolling device which may include a first mandrel (not shown) from which the yarn 150 can be unwound, the first mandrel can be a storage mandrel for the yarn 150 before it is coated, and a second mandrel (not shown) on which the yarn 150 can be wound once coated. The yarn may be continuous, extending continuously between the first mandrel and the second mandrel through the reactor 120. The yarn 150 may be moved in the reactor 120 during the method. A segment to be treated of the yarn 150 can thus circulate in the reactor 120 from the first mandrel to the second mandrel. Elements 125 and 124a-b for centering the yarn 150 in the reactor 120 reduce the risk of the yarn 150 touching the wall of the reactor 120. The scrolling device can be controlled by control means not shown, so as to scroll the yarn 150 in the device 100 continuously or step by step. The scrolling of the yarn 150 can be controlled depending on the method parameters, and in particular on the deposition kinetics, in order to finely control the thickness of the coating deposited.

In the example of FIG. 1, the yarn 150 circulates in the reactor 120 and is partly immersed in the liquid precursor 140. The movement of the yarn can be continuous (uninterrupted) or step by step. A segment 156 of the treated yarn initially circulates in the first vertical portion 122 without being immersed in the liquid precursor 140, the segment is then immersed in the liquid precursor 140 in the first vertical portion 122, then remains immersed in the liquid precursor 140 in the horizontal portion 121 and in a portion of the second vertical portion 123. The segment of the yarn 150 then leaves the liquid precursor 140 to be routed to the reaction zone 115 where the coating is formed on its surface from the gas phase in a microwave field. The following describes the formation of the gas phase in this example.

The liquid precursor 140 is here evaporated by thermal conduction along the yarn from the segment 156 heated in the reaction zone 115 to the meniscus 145. The reactor 120 is provided with at least one channel 154a, 154b for introducing a diluent gas 200a, 200b. The reactor 120 is here provided with several channels 154a, 154b for introducing the diluent gas 200a, 200b. When several channels 154a and 154b are present, the diluent gas 200a and 200b introduced into each can be identical or different, for example the diluent gas 200a can be reactive and the diluent gas 200b inert. In the example of FIG. 1, the channel(s) 154a, 154b emerge under the meniscus 145 of the liquid precursor 140. The channel(s) 154a, 154b can be carried by the second vertical portion 123 and emerge therein. The channel(s) 154a, 154b can be located below the reaction zone 115. When it is introduced into the reactor, the diluent gas 200a, 200b is directly mixed with the liquid precursor 140, as illustrated in the example of FIG. 1. The diluent gas 200a, 200b is here contacted with the liquid precursor 140 as it is introduced into the reactor 120. The diluent gas 200a, 200b can be introduced into the second vertical portion 123. The mixture of the diluent gas 200a, 200b and the precursor 140 can take place in the second vertical portion 123. The mixing of the diluent gas 200a, 200b and the precursor 140 can take place in a zone of movement of the yarn 150. The mixing of the diluent gas 200a, 200b and of the precursor 140 can take place below the reaction zone 115. In this example, the diluent gas 200a, 200b bubbles in the liquid precursor 140 present in the reactor 120. The mixing between the diluent gas 200a, 200b and the precursor 140 is carried out before the arrival of the gas phase in the reaction zone 115. Regardless of the example considered, the distance separating the mixing zone between the precursor and the diluent gas and the reaction zone can be less than or equal to 15 cm, and for example comprised between 1 cm and 15 cm. In this case in the example illustrated, the diluent gas 200a, 200b is first mixed with the liquid precursor 140, which is then evaporated so as to obtain the gas phase comprising a mixture of the diluent gas and the coating precursor at the vapor state, this gas phase then propagates towards the reaction zone 115 and is introduced into this zone 115 so as to form the coating on the treated yarn. The diluent gas is separate from the coating precursor in the vapor state. As indicated above, the reaction zone 115 is in particular devoid of liquid coating precursor, the coating precursor being therein only in vapor form in the example illustrated. It will also be noted that the reactor does not have a heating system at the liquid precursor 140. The system can nevertheless include a device for regulating the temperature (not shown) of the liquid precursor 140 in order to maintain it at a moderate temperature if this is desired depending on the precursor used, for example less than or equal to 20° C.

The diluent gas 200a, 200b can be reactive or inert with respect to the precursor 140. Thus, the diluent gas 200a, 200b can react with the carbon of the coating precursor in order to consume the excess carbon compared to the stoichiometry desired for the deposition before introduction of the coating precursor in the vapor state into the reaction zone 115. This reaction can take place in the gas phase before its introduction into the reaction zone 115, the diluent gas 200a, 200b reacting with the excess carbon of the precursor coating in the vapor state. Alternatively or in combination and as indicated above, the diluent gas 200a, 200b can react with the excess carbon of the coating formed in the reaction zone 115. The reactive diluent gas 200a, 200b can be hydrogen or ammonia. The inert diluent gas 200a, 200b can be dinitrogen or argon.

By way of example, the liquid coating precursor 140 can be a silicon carbide precursor. In this case, the precursor 140 may include one or more silicon atoms, one or more carbon atoms and optionally hydrogen. In particular, the precursor 140 may include at least one Si—C bond, and optionally at least one Si—H bond and/or at least one Si—Si bond. As examples of usable silicon carbide precursors 140, mention may be made of 1,3,5 Trisilacyclohexane (TSCH), hexamethyldisilane (HMDS) or else triethylsilane. In the case of the use of HMDS, it may be advantageous to choose a diluent gas capable of consuming the excess carbon of the precursor in order to obtain pure SiC on the yarn 150.

By way of example, in the case of a deposition of silicon carbide, the temperature of the yarn 150 in the reaction zone 115 can be comprised between 800° C. and 1300° C., for example between 950° C. and 1200° C.

Alternatively, the coating precursor 140 may be a boron nitride precursor. In this case, the precursor 140 may include one or more boron atoms, one or more nitrogen and hydrogen atoms, and optionally one or more carbon atoms. The precursor 140 can be an aminoborane. The precursor 140 may include at least one B—N bond and optionally at least one N—C bond and/or at least one B—C bond. As an example of usable boron nitride precursor 140, mention may be made of tris(dimethylamino)borane (TDMAB) or triethylaminoborane (TEAB) optionally mixed with ammonia $NH_3$. The use of TDMAB can advantageously be accompanied by the use of a diluent gas reactive with the carbon in order to consume the excess carbon. By way of example, in the case of a deposition of boron nitride, the temperature of the yarn 150 in the reaction zone 115 can be comprised between 900° C. and 1500° C., for example between 1200° C. and 1400° C.

Further alternatively it is also possible to form a silicon nitride coating, for example by using hexamethyldisilazane as coating precursor 140. The portion of the reactor 120 between the meniscus 145 and the reaction zone 115 can be placed under negative pressure to promote the evaporation of the precursor towards the reaction zone 115. The pressure in this portion can nevertheless remain greater than or equal to the vapor pressure of the precursor at the temperature at the meniscus 145, in order to avoid too rapid evaporation of the precursor. The pressure in this portion can generally range from 1 mbar to 3 bar. The choice of the pressure to be imposed depending on the precursor used falls within the general knowledge of the person skilled in the art. For example for TDMAB, the pressure in the reactor can be greater than or equal to 3 mbar at 30° C. or greater than or equal to 160 mbar at 100° C. For TEAB, the pressure in the reactor can for example be greater than or equal to 3 mbar at 75° C. or greater than or equal to 16 mbar at 96° C. For triethylsilane, the pressure in the reactor can for example be greater than or equal to 125 mbar at 50° C.

The flow rate of diluent gas introduced into the reactor 120 can be greater than or equal to the flow rate of precursor 140 evaporated or introduced into the reaction zone 115, for example greater than or equal to twice this flow rate. This allows to obtain a gas phase having a volume fraction of diluent gas greater than or equal to the volume fraction of precursor in the vapor state.

It will be noted that the reactor 120 further comprises additional gas inlet 157a, 157c and outlet 159a, 159c channels downstream of the reaction zone 115. Thus, the segment 156 passes successively into the reaction zone 115 then these channels 157a, 157c and 159a, 159c. A buffer gas, for example dinitrogen or argon, can be is introduced through the channels 157a, 157b and 157c and 159a, 159b and 159c in order to avoid any risk of parasitic deposit at the mandrels of the scrolling device. The gas outlets 159a-159c allow to evacuate the buffer gas introduced as well as any residual vapor phase precursor. As illustrated, each of the two vertical portions 122 and 123 can include at least one inlet channel 157a-c and outlet channel 159a-c pair. The example of reactor 120 illustrated comprises a first buffer gas inlet 157a and outlet 159a pair located between the reaction zone 115 and a centralizer 124a, a second buffer gas inlet channel 157b and outlet channel 159b pair located on the vertical portion 122 upstream of the reaction zone 115 and a third buffer gas inlet channel 157c and outlet channel 159c pair located downstream of the centralizer 124a. In particular, a reduction in the passage section at the centralizer 124a, downstream of the reaction zone 115 will be noted. This advantageously allows to further reduce the leakage of precursor in the residual vapor state and to improve the centering of the yarn. Of course, the reduction of the passage section is not necessarily ensured by the addition of a specific part 124a and can simply be obtained by a local modification of the diameter of the tube forming the reactor. In a variant not shown, the system does not have this passage section reduction.

The example of device 101 in FIG. 2 which will now be described uses the same structure as device 100 in FIG. 1 but supplements it in particular by adding an additional heat treatment zone 210. The portions identical to the device 100 of FIG. 1 bear the same reference symbols and are not described again for the sake of brevity.

Figure 2:
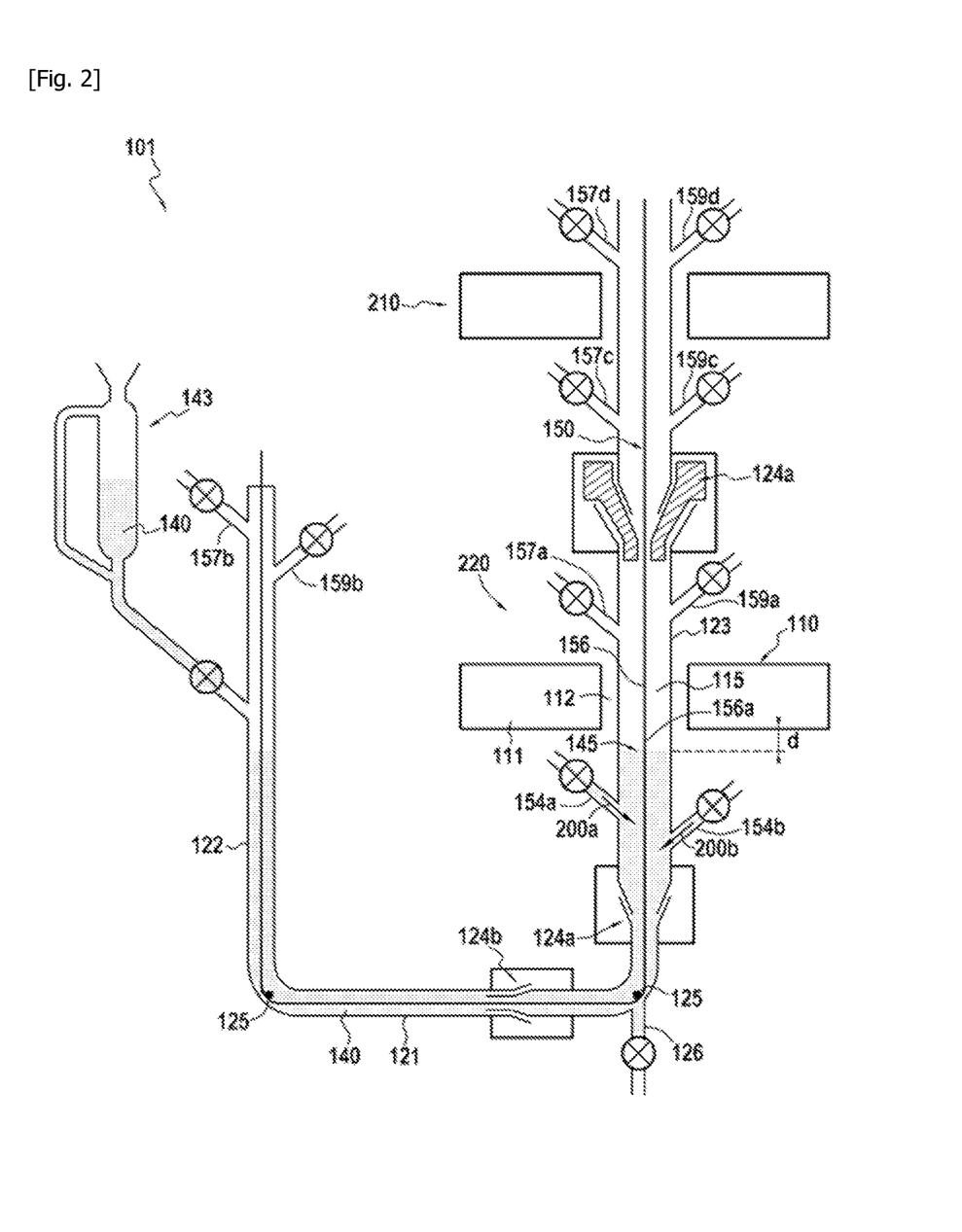
FIG. 2 schematically shows a device for implementing a second example of a method according to the invention.

The reactor 220 of FIG. 2 is thus equipped with an additional treatment zone 210 which is distinct from the reaction zone 115 and downstream of the latter. Thus, the segment 156 of treated yarn passes successively through the reaction zone 115 then through the additional treatment zone 210 where it undergoes a heat treatment. This zone 210 can thus be provided with heating means, it is again possible to use microwave heating but the person skilled in the art will recognize that other heating means are possible. The temperature imposed during the heat treatment in the zone 210 can be greater than or equal to the temperature in the reaction zone 115. The temperature in the zone 210 can be greater than or equal to 1100° C., for example greater than or equal to 1200° C. This temperature can be comprised between 1100° C. and 1700° C., for example between 1200° C. and 1500° C.

As indicated above, the heat treatment carried out in the zone 210 can result in dehydrogenation, crystallization or stabilization of the coating formed in the reaction zone 115. It is possible, for example, to carry out, in the zone 210, a crystallization or stabilization of a coating of boron nitride by imposing on the yarn a temperature comprised between 1200° C. and 1500° C. Alternatively, it is possible to carry out a heat treatment for the dehydrogenation of a silicon carbide coating by imposing on the yarn 150 a temperature comprised between 1100° C. and 1500° C.

The reactor 220 is further provided with an inlet 157d and an outlet 159d for buffer gas on either side of the zone 210 in order to inert this zone and avoid parasitic depositions. Alternatively, a reactive gas can be introduced through the inlet 157d allowing the dehydrogenation of the coating formed in the reaction zone 115. FIG. 2 illustrates an additional treatment zone 210 distinct and offset from the reaction zone 115 along the direction of movement of the yarn 150. Nevertheless, the scope of the invention is not departed from when the reaction zone 115 is heated to a sufficient temperature to both carry out the deposition on the yarn as well as a heat treatment for modifying this deposition, for example dehydrogenation, crystallization or stabilization as carried out in zone 210. In the latter case, taking into account the high temperatures imposed in the reaction zone 115, it may be advantageous to provide a sufficient distanced between the reaction zone 115 and the precursor meniscus 145, in order to carry out the desired additional treatment without disturbing the evaporation of the precursor by thermal conduction along the yarn. By way of example, this distance may be greater than or equal to 5 cm, for example comprised between 5 cm and 15 cm.

Figure 3:
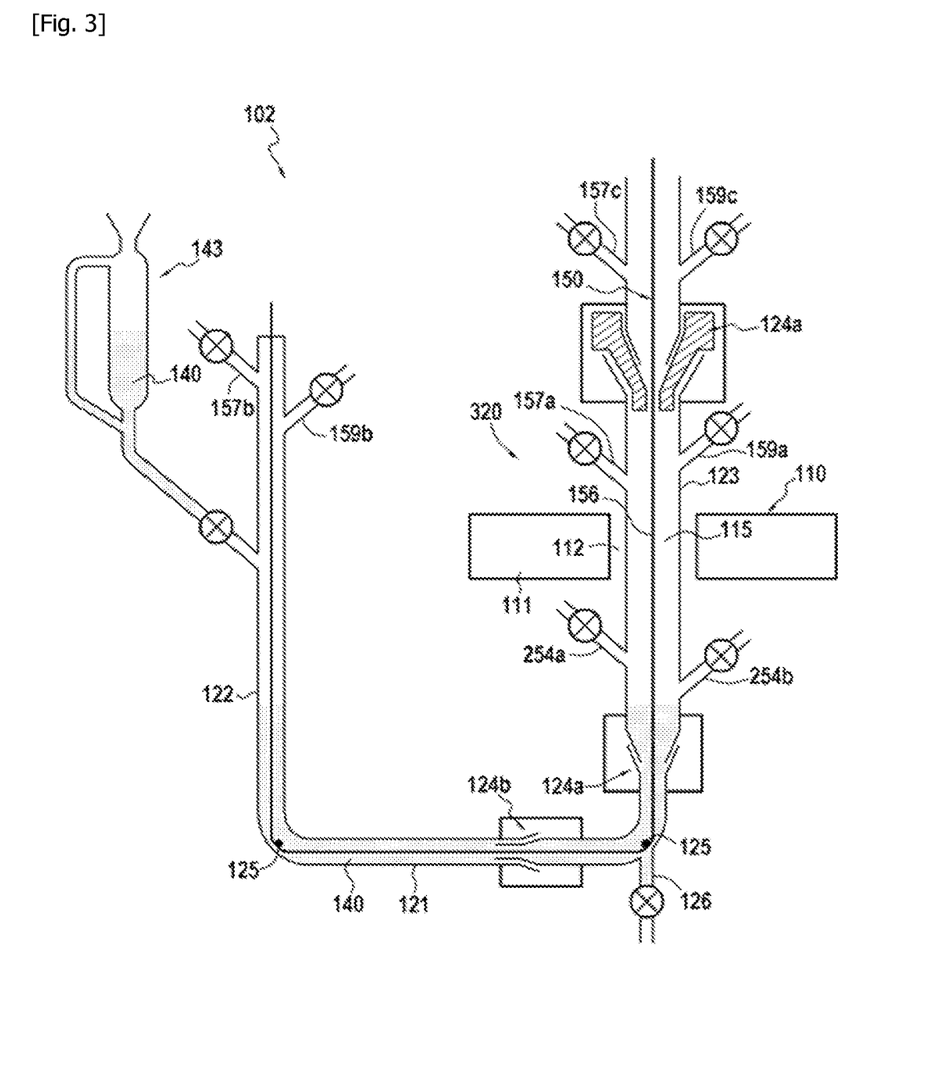
FIG. 3 schematically shows a device for implementing a third example of a method according to the invention.

The examples of the method which have just been described in connection with FIGS. 1 and 2 relate to an introduction of the diluent gas directly into the liquid precursor 140. FIG. 3, which will now be described, relates to a device 102 in which the diluent gas is mixed directly with the precursor in the vapor state. The portions identical to those described above are omitted for reasons of brevity.

The reactor 320 illustrated in FIG. 3 comprises at least one diluent gas introduction channel 254a, 254b which emerges between the meniscus 145 and the reaction zone 115. The diluent gas no longer bubbles in the liquid precursor 140 but is mixed with the precursor in the vapor state upstream of the reaction zone 115 after the evaporation of the liquid precursor 140 in the reactor 320. The diluent gas is here introduced above liquid precursor meniscus 140. The gas phase obtained after this mixture then propagates to the reaction zone 115 to form the coating. In a variant not illustrated, it would be possible to combine an introduction of the diluent gas both into the liquid precursor and into the precursor in the vapor state. Also, an additional treatment zone 210 can be added downstream of the reaction zone 115 as described in FIG. 2.

Figure 4:
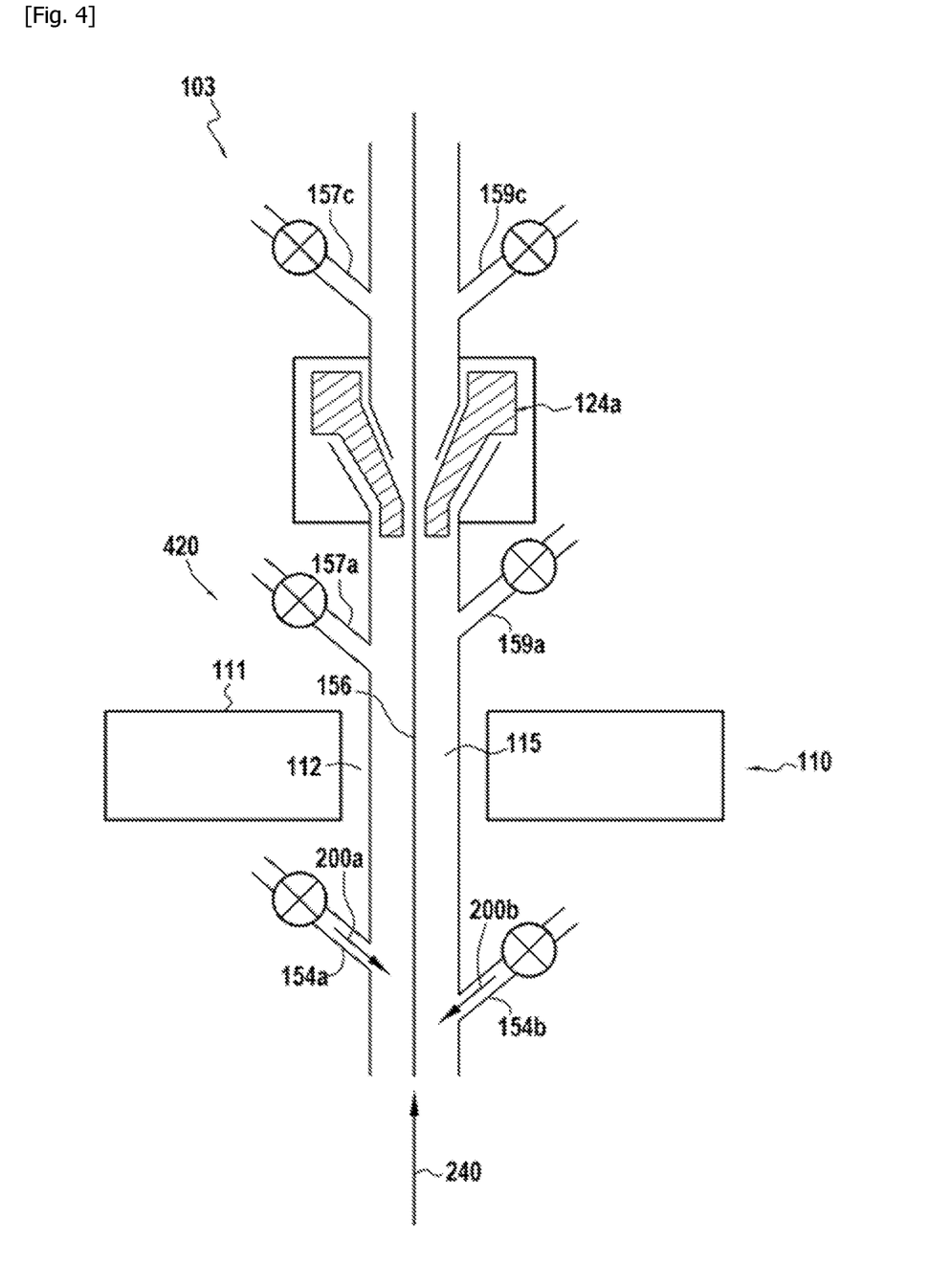
FIG. 4 schematically shows a device for implementing a fourth example of a method according to the invention.

The variant of FIG. 4 relates to the case where the precursor is directly introduced in the vapor state into the reactor. In the example of device 103 of FIG. 4, the diluent gas 200a, 200b is injected into the reactor 420 and mixed directly with a flow of precursor in the vapor state 240. The pressure in the reactor 420 can be comprised between 1 mbar and 3 bar.

The flow rate of diluent gas 200a, 200b introduced into the reactor 420 may be greater than or equal to the flow rate of precursor 240 in the vapor state introduced into the reactor 420, for example greater than or equal to twice this flow rate of precursor introduced into the reactor 420. This allows to obtain a gas phase having a volume fraction of diluent gas greater than or equal to the volume fraction of the precursor in the vapor phase.

The figures illustrate devices 100-103 in which a single yarn 150 is treated but the invention also applies to simultaneous treatment of a plurality of yarns in the reactor. The treatment of a yarn can, moreover, comprise several passages of the yarn in the reactor so as to deposit each time an additional coating on the coating formed during the preceding passage. The coating thus deposited can be monomaterial or multimaterial. In the examples illustrated, there is no liquid precursor in the reaction zone, however the scope of the invention is not departed from when liquid precursor is present in the reaction zone in addition to the gas phase introduced into this zone.

The method can continue by manufacturing a composite material part from several yarns coated in the manner described above.

The manufacture of the part may thus include the manufacture of a fibrous preform, intended to form the fiber reinforcement of the part, from a plurality of coated yarns. The fibrous preform can be obtained by weaving, for example by three-dimensional weaving, of the coated yarns. An interlock weave pattern can be used, for example.

The porosity of the fibrous preform can then be filled with a die in order to obtain the composite material part. The matrix may be an at least partially ceramic matrix. In a manner known per se, this matrix can be formed by chemical vapor infiltration or by a Melt-Infiltration ("MI") technique. The matrix may comprise silicon carbide.

The part obtained can be a part of a turbomachine, for example of an aeronautical turbomachine or an industrial turbomachine. The part obtained can be a turbine part. The part obtained can be a turbomachine blade, for example a turbine blade. The part obtained can alternatively be a sector of a turbine ring.

EXAMPLES

Example 1: Deposition of Silicon Carbide

Figure 5:
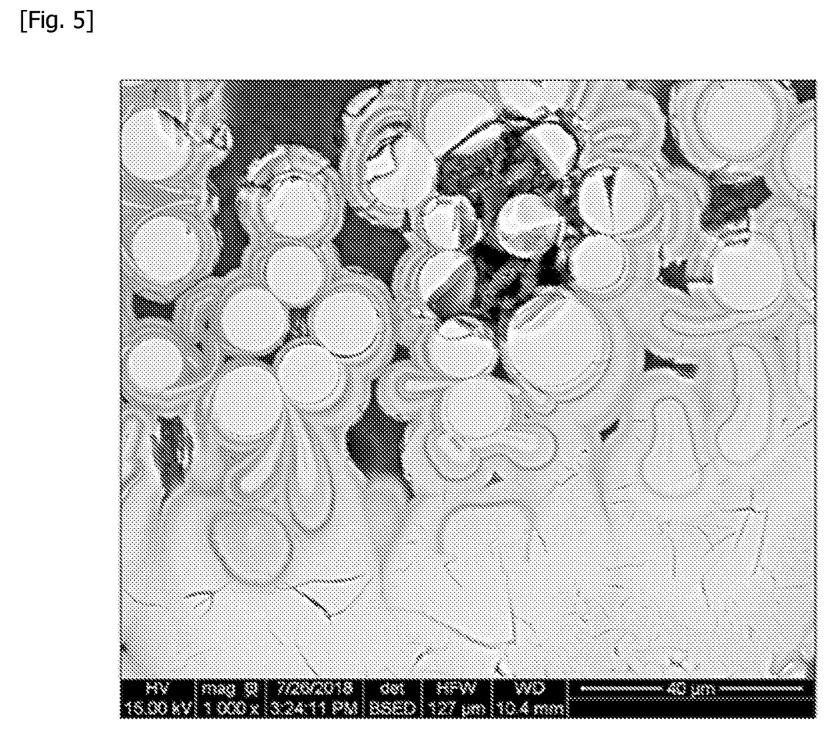
FIG. 5 is a photograph of a section of a coated yarn obtainable within the scope of the invention.

A test was carried out using the device 100 illustrated in FIG. 1. The precursor used was HMDS, the temperature of the reaction zone 115 was maintained at 1070° C. for 3 minutes. Nitrogen was used as the diluent gas 200a, 200b. The volume fractions of diluent gas and precursor in the gas phase were each 50%. The SiC deposition is effective with reaction zone kinetics of 500 μm/min. In the test carried out, the yarn was static. FIG. 5 is a cross-sectional view of the resulting coated yarn.

Example 2: Deposition of Boron Nitride

Figure 6:
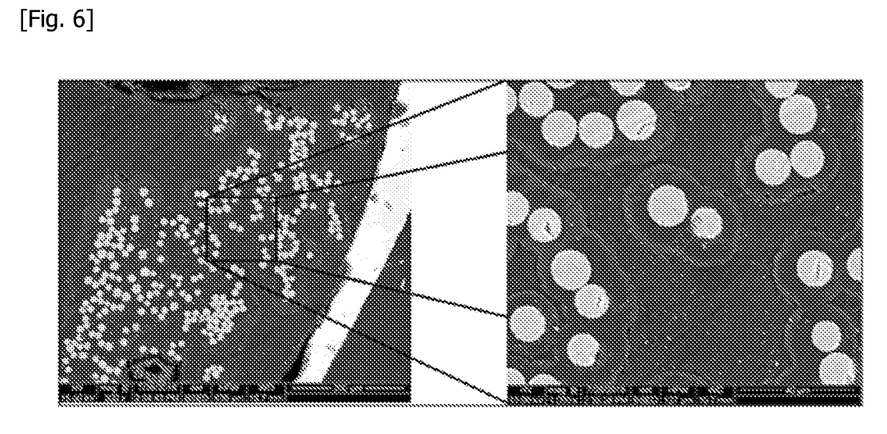
FIG. 6 is a photograph of a section of another coated yarn obtainable within the scope of the invention.

A test was carried out using the device 100 illustrated in FIG. 1. The precursor used was TDMAB, the temperature of the reaction zone 115 was maintained at 1270° C. for 12 minutes. Nitrogen was used as the diluent gas 200a, 200b. The volume fractions of diluent gas and precursor in the gas phase were each 50%. The deposition of BN is effective with a kinetics in the reaction zone of 1.7 μm/min. In the test carried out, the yarn was static. A composite material part was then formed from the coated yarns obtained. FIG. 6 is a cross-sectional view of the resulting coated yarn.

The expression "comprised between . . . and . . . " must be understood as including the limits.

The invention claimed is:

1. A method for treating a carbon or ceramic yarn comprising forming a coating on the yarn in a reaction zone of a reactor by heating a segment of the yarn in the presence of a gas phase in a microwave field, wherein the gas phase comprises a mixture of a diluent gas and a coating precursor in the vapor state, and wherein the gas phase is formed at least by introducing the diluent gas into the reactor, said introduced diluent gas being mixed with liquid coating precursor as it is introduced into the reactor before the reaction zone, wherein the diluent gas bubbles in said liquid coating precursor and is introduced into the reactor below a meniscus of said liquid coating precursor.

2. The method according to claim 1, wherein the diluent gas reacts with excess carbon from the coating precursor before the reaction zone and/or with excess carbon from the coating formed in the reaction zone.

3. The method according to claim 2, wherein the reactive diluent gas includes dihydrogen or ammonia.

4. The method according to claim 1, wherein the diluent gas is inert with respect to the coating precursor and/or with respect to the coating formed in the reaction zone.

5. The method according to claim 1, wherein forming the gas phase comprises evaporating the liquid coating precursor in the reactor by contact with a hot portion of the yarn adjacent to the segment present in the microwave field.

6. The method according to claim 1, wherein a volume fraction of diluent gas in the gas phase is greater than or equal to a volume fraction of coating precursor in the vapor state in the gas phase.

7. The method according to claim 1, wherein the coating precursor is a silicon carbide precursor, a boron nitride precursor or a silicon nitride precursor.

8. The method according to claim 1, wherein the yarn is moved in the reactor, and wherein the segment of yarn covered with the coating is transported to an additional treatment zone separate from the reaction zone where it undergoes a heat treatment, a temperature imposed in the additional treatment zone being greater than or equal to 1100° C.

9. The method according to claim 8, wherein the heat treatment leads to dehydrogenation of the coating covering the yarn.

10. The method according to claim 8, wherein the heat treatment leads to a crystallization or stabilization of the coating covering the yarn.

11. The method for manufacturing a composite material part, comprising:
    forming a fibrous preform of the part from yarns treated by the method according to claim 1, and
    forming a matrix in the porosity of the obtained fibrous preform.

12. The method according to claim 11, wherein the matrix is at least partially ceramic.

13. A method for treating a carbon or ceramic yarn comprising forming a coating on the yarn in a reaction zone of a reactor by heating a segment of the yarn in the presence of a gas phase in a microwave field, wherein the gas phase comprises a mixture of a diluent gas and a coating precursor in the vapor state, and wherein the gas phase is formed at least by introducing the diluent gas into the reactor and mixing the introduced diluent gas with the coating precursor in the reactor before the reaction zone, wherein the yarn is moved in the reactor, and wherein the segment of yarn covered with the coating is transported to an additional treatment zone separate from the reaction zone where it undergoes a heat treatment without depositing a supplemental coating on the yarn in said additional treatment zone, the temperature imposed in the additional treatment zone being greater than or equal to 1100° C.

14. The method according to claim 13, wherein the reactor further comprises, upstream the additional treatment zone, an inlet through which a buffer gas is introduced, and an outlet through which said buffer gas is removed, so as to inert the additional treatment zone and avoid parasitic depositions therein.

* * * * *